United States Patent [19]

Hayase et al.

[11] Patent Number: 5,139,968
[45] Date of Patent: Aug. 18, 1992

[54] METHOD OF PRODUCING A T-SHAPED GATE ELECTRODE

[75] Inventors: Iwao Hayase; Takuji Sonoda, both of Itami, Japan

[73] Assignee: Mitsubishi Denki Kabushiki Kaisha, Tokyo, Japan

[21] Appl. No.: 606,855

[22] Filed: Oct. 31, 1990

Related U.S. Application Data

[62] Division of Ser. No. 454,386, Dec. 21, 1989, abandoned.

[30] Foreign Application Priority Data

Mar. 3, 1989 [JP] Japan .................................. 1-52649

[51] Int. Cl.$^5$ .......................................... H01L 21/28
[52] U.S. Cl. ................................... 437/175; 437/176; 437/184; 437/912; 148/DIG. 140
[58] Field of Search .................... 437/38, 39, 40, 175, 437/184, 912; 148/DIG. 139, DIG. 140; 357/15

[56] References Cited

U.S. PATENT DOCUMENTS

| | | | |
|---|---|---|---|
| 4,224,089 | 9/1980 | Nishimoto et al. | 437/912 |
| 4,616,400 | 10/1986 | Macksey et al. | 437/912 |
| 4,733,283 | 3/1988 | Kuroda | 357/55 |
| 4,792,531 | 12/1988 | Kakihana | 437/184 |
| 4,818,724 | 4/1989 | Cetronio et al. | 357/55 |
| 4,865,952 | 9/1989 | Yoshioka et al. | 437/176 |
| 4,929,567 | 5/1990 | Parks et al. | 437/176 |
| 4,959,326 | 9/1990 | Roman et al. | 437/912 |
| 4,975,382 | 12/1990 | Takasugi | 437/912 |
| 4,981,809 | 1/1991 | Mitsuaki et al. | 437/912 |
| 4,984,036 | 1/1991 | Sakamoto et al. | 357/22 |
| 4,997,778 | 3/1991 | Sim et al. | 437/912 |

FOREIGN PATENT DOCUMENTS

| | | |
|---|---|---|
| 0252888 | 1/1988 | European Pat. Off. . |
| 2222308 | 2/1990 | European Pat. Off. ............ 437/912 |
| 57-52174 | 3/1982 | Japan . |
| 59-193069 | 11/1984 | Japan . |
| 61-89681 | 5/1986 | Japan . |
| 61-190985 | 8/1986 | Japan . |
| 62-13081 | 1/1987 | Japan . |
| 62-37973 | 2/1987 | Japan . |
| 63-133680 | 6/1988 | Japan . |
| 63-187665 | 8/1988 | Japan . |
| 63-208275 | 8/1988 | Japan . |
| 0024465 | 1/1989 | Japan ................................. 437/912 |
| 1-51666 | 2/1989 | Japan . |
| 0171278 | 7/1989 | Japan ................................. 437/912 |
| 0016734 | 1/1990 | Japan ................................. 437/184 |
| 0049441 | 2/1990 | Japan ................................. 437/176 |

OTHER PUBLICATIONS

Taylor et al, "High-Efficiency 35-GHz GaAs MESFET's", Jun. 1987, pp. 1259-1263.

Primary Examiner—Mary Wilczewski
Attorney, Agent, or Firm—Leydig, Voit & Mayer

[57] ABSTRACT

A semiconductor device includes a relatively broad recess in a semiconductor substrate between a source electrode and a drain electrode, a relatively narrow, deeper recess closer to the source electrode than to the drain electrode, and a T-shaped gate electrode having a broad head disposed in the narrower recess. A production method for a semiconductor device having a T-shaped gate electrode provided with a broad head and disposed in a two stage recess includes producing a relatively broad recess in a semiconductor substrate leaving a dummy gate, producing a resist pattern for producing the head of the T-shaped gate electrode, exposing the dummy gate by removing some of the resist pattern, and thereafter producing a narrower, deeper recess closer to the source electrode than to the drain electrode, thereby producing a two stage recess structure and producing a T-shaped gate electrode in the deeper recess.

3 Claims, 5 Drawing Sheets

WGS < WGD

FIG. 2(g) (PRIOR ART)     WGS < WGD

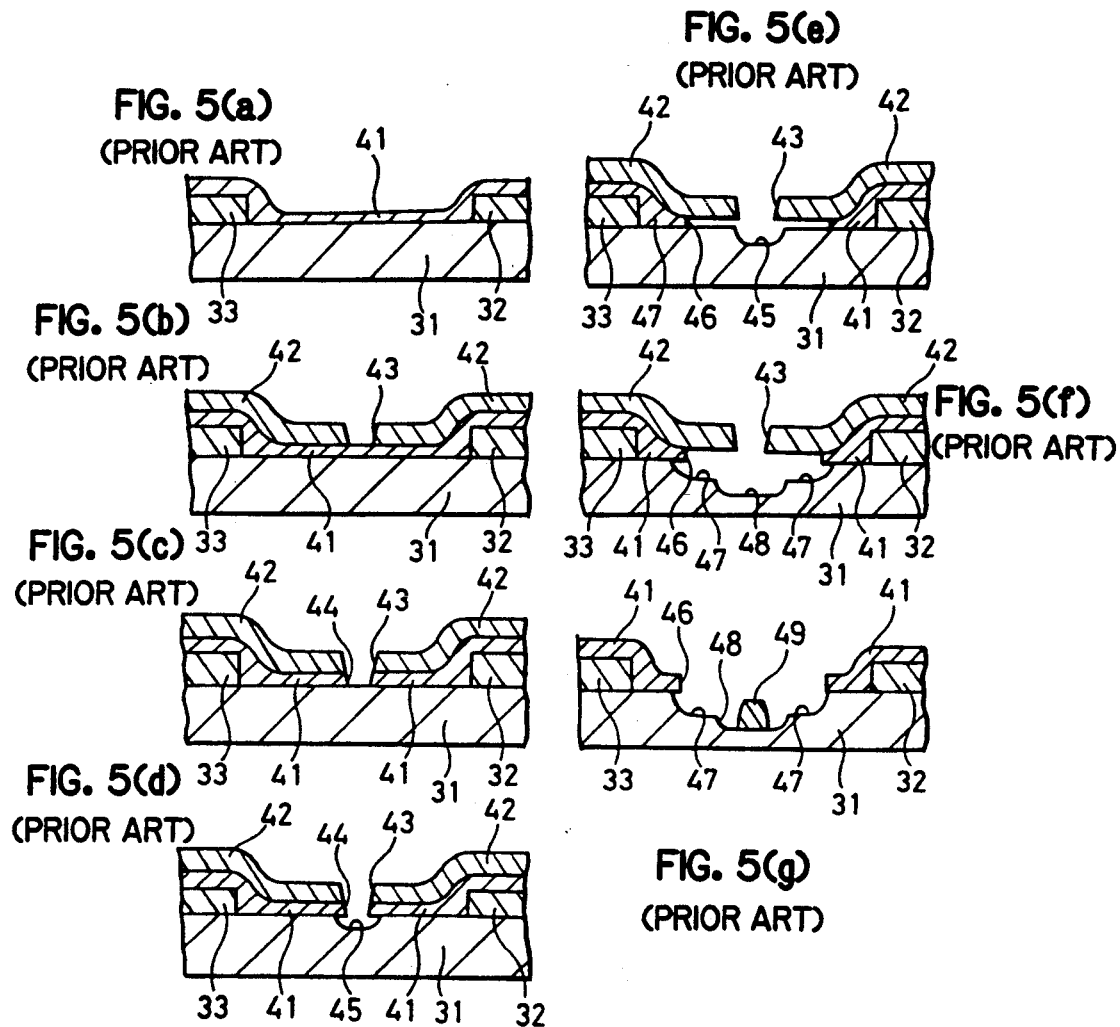

METHOD OF PRODUCING A T-SHAPED GATE ELECTRODE

This application is a division of application Ser. No. 07/454,386, filed Dec. 21, 1989, now abandoned.

FIELD OF THE INVENTION

The present invention relates to a semiconductor device and a production method therefor and, more particularly, to a field effect transistor (FET) having a two stage recess and a T-shaped gate therein.

BACKGROUND OF THE INVENTION

FIG. 3 shows a recess structure and a T-shaped gate electrode structure of a prior art field effect transistor. In FIG. 3, reference numeral 1 designates a GaAs substrate. An active layer 2 is disposed on the GaAs substrate 1. A recess 22 is disposed in the active layer 2, and a T-shaped gate electrode 23' is disposed on the recess 22. Reference character w represents the width of the recess, t represents the depth of the recess, a represents the thickness of the active layer 2 below the gate electrode 23', and lg represents the length of the gate electrode 23'.

A production method of the prior art field effect transistor will be described with reference to FIGS. 4(a) to 4(j).

As shown in FIG. 4(a), a nitride film 3 is deposited on the active layer 2 on the substrate 1 by plasma chemical vapor deposition (CVD) and an electron beam resist such as polymethylmethacrylate (PMMA) resist 20 is deposited thereon by spin coating.

Next, as shown in FIG. 4(b), an electron beam 21 irradiates the PMMA resist 20 which is developed to produce an aperture 20a, as shown in FIG. 4(c).

Next, as shown in FIG. 4(d), the nitride film 3 is etched by reactive ion etching (RIE) using the resist 20 as a mask. Thereafter, as shown in FIG. 4(e), the active layer 2 is chemically etched to produce a recess 22.

Thereafter, as shown in FIG. 4(f), the PMMA resist 20 is removed and, as shown in FIG. 4(g), a gate metal 23 is deposited on the entire surface by vapor deposition.

Next, as shown in FIG. 4(h), the pattern of the head of a T-shaped gate is produced utilizing a negative resist 24. As shown in FIG. 4(i), the gate metal 23 is etched by ion milling, thereby producing a gate electrode 23'.

Finally, as shown in FIG. 4(j), the negative resist 24 and the nitride film 3 are removed, thereby producing a recessed T-shaped gate field effect transistor having a T-shaped gate electrode 23' in the recess 22.

The FET is produced with a recessed structure. A portion of the active layer 2 where the gate electrode is to be produced is etched to an active layer thickness a for a corresponding carrier concentration N to obtain a predetermined current value. The recess width w and the recess depth t greatly affect RF performance and the reverse gate breakdown voltage. Further, there is a tendency that as the reverse gate voltage is increased, the RF performance deteriorates. These effects are thought to be caused by broadening of the depletion layer which determines the reverse gate breakdown voltage and the parasitic resistance and parasitic capacitance which have a large influence on RF performance. The parasitic element values vary significantly depending on the recess structure, so that optimization of the recess width w and recess depth t are attempted. However, control of the recess width w and recess depth t is restricted by desired enhancement of breakdown voltage and performance. In the prior art single stage recess structure, concentration of electric fields at the recess edges may arise, thereby failing to reduce the electric field between the gate and drain. On the other hand, to improve the parasitic resistances and capacitances, a T-shaped gate structure is adopted. However, even the adoption of such T-shaped gate structure cannot sufficiently reduce parasitic resistances and capacitances in a single stage recess structure.

As discussed above, in the prior art FET, there are many restrictions on the enhancement of breakdown voltage and that of performance, and it was difficult to reduce the parasitic resistances between the gate and source only by the optimization of the recess width w and the recess depth t of a single stage recess with a T-shaped gate. Further, in such a recessed structure, the electric fields between the gate and drain are unfavorably concentrated at a recess edge.

FIGS. 5(a) to 5(g) show major production steps of a semiconductor device having a two stage recess structure, as disclosed in Japanese Published Patent Application 61-89681. In the figures, reference numeral 31 designates a semiconductor substrate. A source electrode 32 and a drain electrode 33 are disposed on the semiconductor subtsrate 31. A spacer film 41 is disposed on the entire surface on the substrate and on electrodes 32 and 33. A photoresist film 43 is disposed on the spacer film 41. A window 43 is opened in the photoresist 42. A first aperture 44 is opened in the spacer film 41 by etching utilizing the window 43 of the of the photoresist film 42 as a mask. A concave portion 45 is produced in the substrate 31 by etching through the window 43 and the first aperture 44. A second aperture 46 is produced in the spacer film 41 by again etching the spacer film 41 through the window 43 of the photoresist 42. A first stage recess 47 is produced on the substrate 31 by etching through the window 43 and the second aperture 46. Then, a second stage recess 48 is produced at the center of the first stage recess 47 on the substrate 31. A gate electrode 49 is produced on the second stage recess 48.

As shown in FIG. 5(a), a source electrode 32 and a drain electrode 33 are deposited on the main surface of semiconductor substrate 31 with a predetermined distance therebetween. A spacer film 41 is deposited over the main surface of the semiconductor substrate 31 and the surfaces of the source and drain electrodes 32 and 33. The spacer film 41 is a silicon nitride film or a silicon oxide film. This spacer film 41 can be etched by a second etching solution which is different from the first etching solution for etching the semiconductor substrate 31.

Next, as shown in FIG. 5(b) a photoresist film 42 is deposited on the surface of the spacer film 41. A window having a pattern corresponding to the pattern of the gate electrode is disposed on a portion of the photoresist film 42 corresponding to a portion of the semiconductor substrate 31 where a gate electrode is to be produced between the source electrode 31 and the drain electrode 33.

Next, as shown in FIG. 5(c), using the photoresist 42 having a window 43 as a mask, a first aperture 44 having a pattern corresponding to the pattern of the window 43 is produced in the spacer film 41 by etching utilizing the second etching solution.

Next, as shown in FIG. 5(d), a concave portion 45 for producing a second recess is produced at the main surface portion of the semiconductor substrate 31 by etching utilizing the first etching solution with the spacer film 41 having a first aperture 44 as a mask.

Next, as shown in FIG. 5(e), a second aperture 46 having a pattern corresponding to the pattern of the first stage recess is produced by expanding the pattern of the first aperture 44 at the spacer film 41 by etching utilizing the second etching solution with the photoresist film 42 having the window 43 as a mask.

Next, as shown in FIG. 5(f), a first stage recess 47 having a pattern corresponding to a pattern of the second aperture 46 is produced at a portion of the main surface of the semiconductor substrate 31 by etching utilizing the first etching solution with the spacer film 41 having the second aperture portion 46 as a mask. At the same time, a second stage recess 48 corresponding to the pattern of concave portion 45 is produced at a portion of the bottom surface of the first stage recess 47.

Finally, as shown in FIG. 5(g), a gate electrode metal film is deposited on the surface of the photoresist film 42 having a window 43 and on the bottom surface of the second stage recess 48. The photoresist film 42 is removed together with the gate metal film on the surface thereof by lift-off, thereby producing a gate electrode 49 on the bottom surface of the second stage recess 48, completing an element having a two stage recess structure.

In the semiconductor device according to the above-described production method, the gate electrode can be produced in a two stage recess structure, and concentration of electric field at the recess edges is relaxed, thereby increasing the breakdown voltage of the device.

In the prior art production method, however, since the gate electrode is produced at the central portion of the recess, the gate-to-source distance is equal to the gate-to-drain distance. Therefore, an enhancement of the drain breakdown voltage leading to an enhancement in RF performance and a reduction in the gate-to-source capacitance and the source resistance cannot be accomplished at the same time. Further, according to such a production method, the gate electrode has a trapezoidal configuration and it is quite difficult to produce a gate shorter than 0.5 micron in length. Further, it is necessary to use an electron beam (EB) or focused ion beam (FIB) in order to miniaturize the gate length, thereby resulting in a problem in mass production. Further, in such a gate electrode structure, the gate cross-sectional area is reduced, which makes reduction of gate resistance difficult. Further, according to the above-described production method, the width of the first stage recess 47 is determined by the degree of side etching of the spacer film 41 in the process of FIG. 5(e). The desired end point of the side etching is difficult to detect because at that end point the side wall is located below the photoresist 42 which results in difficulty in etching with high controllability and high reproducibility. Thus, there are many restrictions on enhancement of the breakdown voltage and performance in the prior art semiconductor device and in the production method therefor, and, therefore, it has been difficult to enhance the reverse gate breakdown voltage and to reduce the gate resistance and gate-to-source parasitic resistance simultaneously.

SUMMARY OF THE INVENTION

An object of the present invention is to provide a semiconductor device having a low parasitic resistance, a low parasitic capacitance, good RF performance, and a high reverse gate breakdown voltage.

Another object of the present invention is to provide a semiconductor device having high efficiency, a high breakdown voltage, and which is superior in reproducibility.

Still another object of the present invention is to provide a production method for such a semiconductor device.

Other objects and advantages of the present invention will become apparent from the detailed description given hereinafter. It should be understood, however, that the detailed description and specific embodiments are given by way of illustration only since various changes and modifications within the spirit and scope of the invention will become apparent to those skilled in the art from the detailed description.

According to an aspect of the present invention, a semiconductor device is provided with a broad recess in a semiconductor substrate between a source and a drain electrode, and a narrower recess within the broad recess closer to the source electrode than to the drain electrode, and a T-shaped gate electrode disposed in the narrow recess and having a broad head.

According to another aspect of the present invention, a production method for a semiconductor device includes producing a broad recess on a semiconductor substrate, leaving a dummy gate, producing a pattern for producing a head of the T-shaped gate electrode, exposing the dummy gate utilizing the pattern and producing a narrower deeper recess in the broad recess closer to the source electrode, and producing a T-shaped gate electrode in the narrower recess. In greater detail, the method includes producing a first nitride film on an active layer of a semiconductor substrate, etching the first nitride film and the active layer using a first resist pattern as a mask, producing a gate/source recess of width $W_{GS}'$, a gate/drain recess of width $W_{GD}'$, and a dummy gate of width $W_G'$ in a relation of $W_{GS}' < W_{GD}'$ (herein, $W_{GS}' + W_G' + W_{GD}' = W$, where W is the width of the broad recess), removing the first resist pattern and the first nitride film, producing a second nitride film on the entire surface of the substrate burying the dummy gate, the gate/source recess, and the gate/drain recess, producing a second resist pattern having an aperture for a head of a T-shaped gate electrode, etching the second nitride film using this pattern as a mask, exposing the dummy gate, producing a narrower recess of width $W_G$ using the second resist and the second nitride film as a mask, producing a gate/source recess of width $W_{GS}$ and a gate/drain recess of width $W_{GD}$ (herein $W_G + W_{GD} + W_{GS} = W$), producing a T-shaped gate electrode having a broad width top portion in the deeper, narrower recess by lift-off, and removing the second nitride film, thereby producing a semiconductor device having a gate structure in which a T-shaped gate electrode is disposed in a two stage recess.

Since the semiconductor device has a broad recess and a narrow recess in which a gate electrode is disposed, the narrow recess is closer to the source electrode than the drain electrode, and a T-shaped gate electrode is disposed in the narrow recess, electric fields between the gate and drain are dispersed whereby the leakage current between the active layer and the buffer layer is reduced. Further, since the narrow recess is closer to the source electrode than the drain electrode, the source-to-gate parasitic resistance does not increase.

Further, since a T-shaped gate is adopted, a reduction in the parasitic capacitance due to the short gate length (lg) and in the parasitic resistance due to the increase in the gate cross-sectional area is achieved, thereby enhancing both performance and breakdown voltage.

In the production method of a semiconductor device of the present invention, since a recess is etched with the dummy gate in place, with top exposure of the dummy gate, and then a deeper recess is etched, a two stage recess structure is obtained with a high dimensional controllability. Furthermore, since a T-shaped gate electrode is produced after producing the deeper recess, a field effect transistor having a T-shaped gate electrode with an offset two stage recess structure can be made with conventional apparatus, and a high breakdown voltage and a high efficiency FET are obtained at low cost and with high precision. Further, the broad recess and the narrow recess are easily and precisely made, the gate electrode production pattern is produced with high precision, and the T-shaped gate electrode can be easily formed with high precision.

BRIEF DESCRIPTION OF THE DRAWINGS

FIGS. 2(a) to 2(g) are cross-sectional views showing process steps in a method for producing a semiconductor device according to a second embodiment of the present invention;

FIGS. 5(a) to 5(g) are cross-sectional views showing process steps according to a prior art method.

DETAILED DESCRIPTION OF THE PREFERRED EMBODIMENTS

Figure 1:
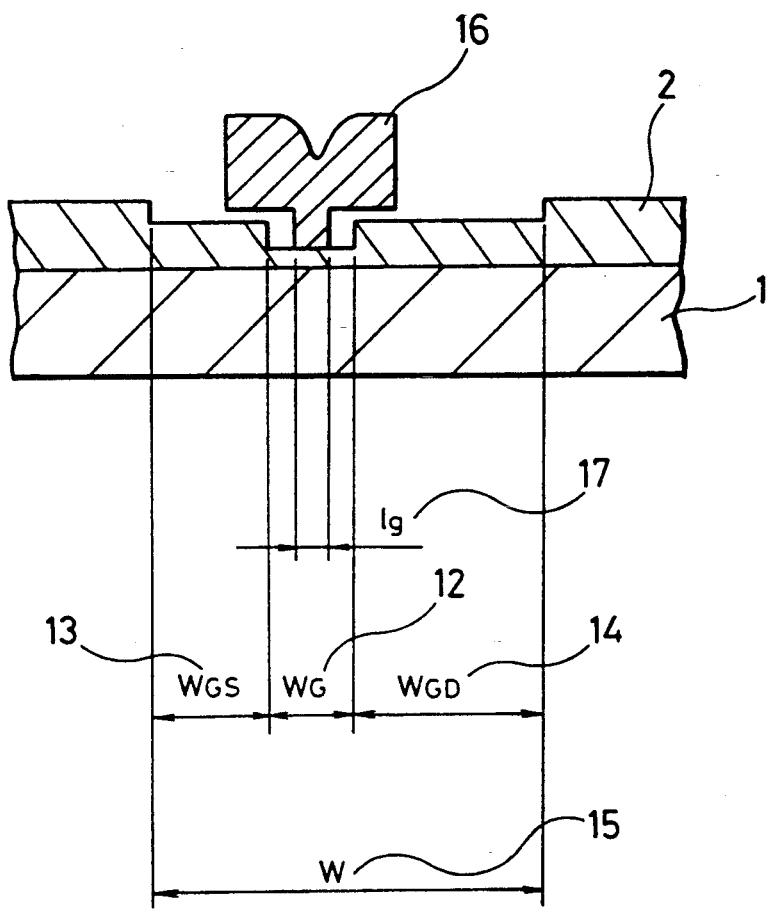
FIG. 1 is a cross-sectional view showing a semiconductor device according to a first embodiment of the present invention.

FIG. 1 shows a field effect transistor as a first embodiment of the present invention, and FIGS. 2(a) to 2(g) are cross-sectional views of process steps in a process for producing the semiconductor device of FIG. 1.

Figure 3:
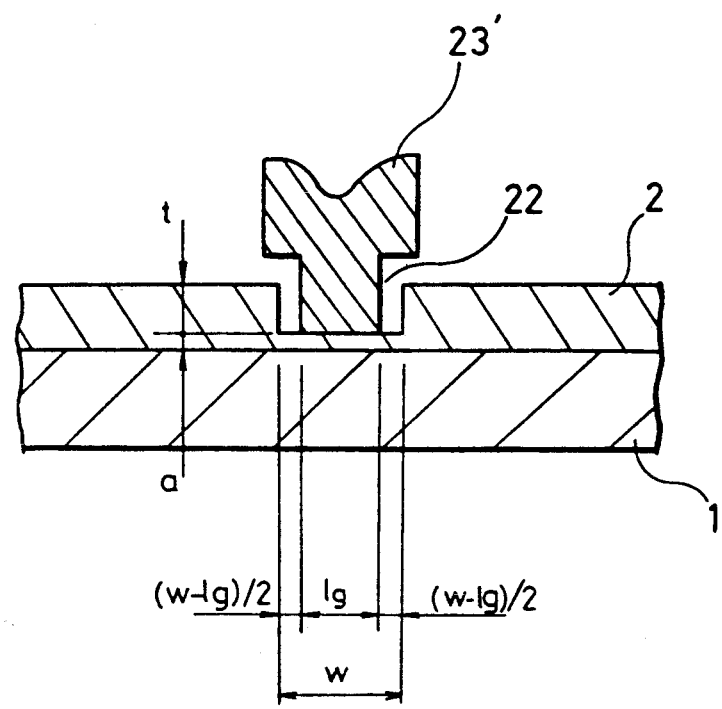
FIG. 3 is a cross-sectional view showing a prior art semiconductor device.
Figure 4A:
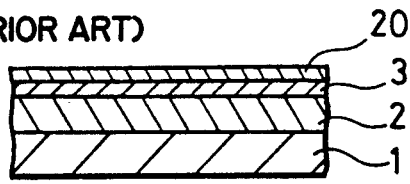
FIGS. 4(a) to 4(j) are cross-sectional views showing process steps in a method for producing the device of FIG. 3.
Figure 4B:
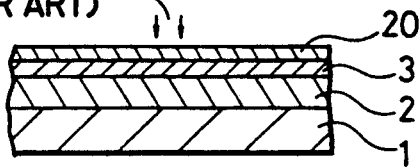
Figure 4C:
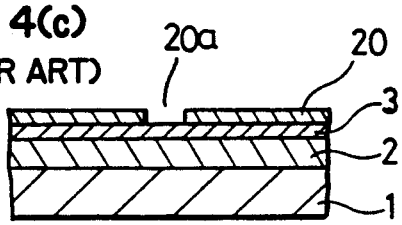
Figure 4D:
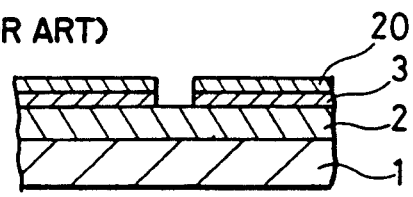
Figure 4E:
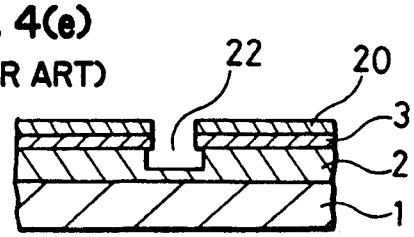
Figure 4F:
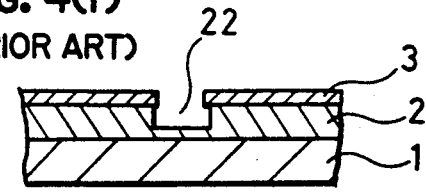
Figure 4G:
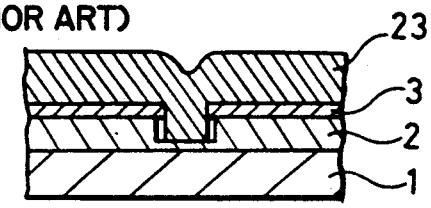
Figure 4H:
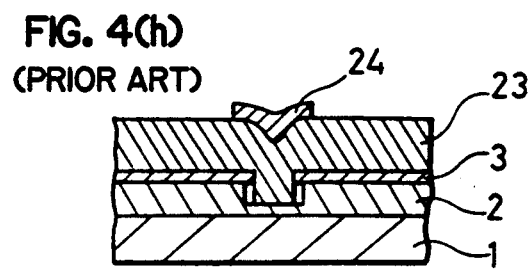
Figure 4I:
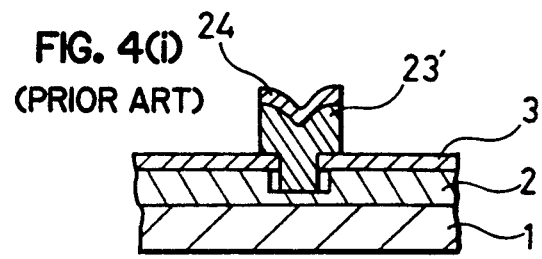
Figure 4J:
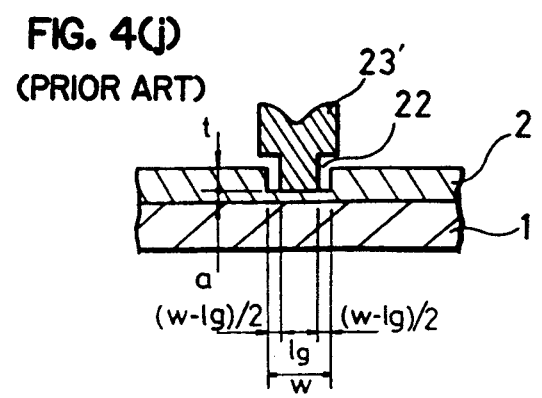

In these figures, the same reference numerals designate the same or corresponding elements as those shown in FIGS. 3 and 4. Reference numeral 4 designates a positive resist which is deposited on the nitride film 3. Reference numeral 5 designates a dummy gate portion having width $W_G'$ which is obtained by chemically etching the active layer 2. Reference numeral 6 designates a gate/source recess aperture, which is obtained by chemical etching of the active layer 2, of width $W_{GS}'$. Reference numeral 7 designates a gate/drain recess, which is obtained by chemical etching of the active layer 2, of width $W_{GD}'$. Reference numeral 8 designates a nitride film deposited on the entire surface of the substrate covering the apertures 6 and 7. Reference numeral 9 designates a resist for producing a T-shaped gate head. Reference numeral 10 designates an aperture corresponding to the T-shaped gate head of the resist 9. Reference numeral 11 designates the top of the dummy gate 5. Reference numeral 12 designates a deeper recess, which is obtained by chemically etching the active layer 2, having a width $W_G$. Reference numeral 13 designates a gate/source recess aperture which is produced after forming recess 12 having width $W_{GS}$. Reference numeral 14 designates a gate/drain recess aperture having width $W_{GD}$ which is similarly produced. Reference numeral 15 designates recess width W of the broader recess. Reference numeral 16 designates a gate electrode and reference numeral 17 designates the gate length, lg, of the gate electrode 16.

Figure 2A:
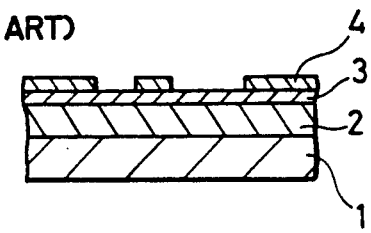

As shown in FIG. 2(a), an active layer 2 is produced to a thickness of about 1 micron by epitaxial growth on the GaAs semiconductor substrate 1 or by ion implantation of the substrate 1. Thereafter, a film 3, such as SiO, SiN, or SiON, is deposited on the active layer 2 to a thickness of 1,000 to 2,000 Angstroms by plasma CVD. A positive resist 4 is deposited thereon and patterned for producing a relatively broad, relatively shallow recess. The resist pattern has a pattern size of 0.4 to 0.5 micron. The width of the source/gate recess aperture is narrower than the width of the drain/gate recess aperture. More preferably, the ratio of width of source/gate recess to that of gate/drain recess is ½.

Figure 2B:
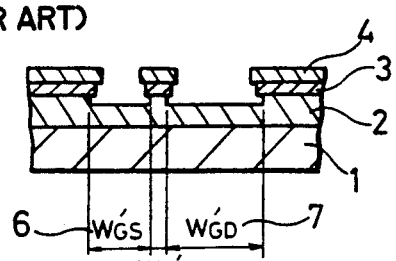

Next, as shown in FIG. 2(b), the nitride film 3 is removed by RIE using the pattern 4 as a mask. The active layer 2 is etched by chemical etching, thereby producing a dummy gate 5 of width $W_G'$ ($\approx 0.2$ micron), a gate/source recess aperture 6 of width $W_{GS}'$, and a gate/drain recess aperture 7 of width $W_{GD}'$.

Figure 2C:
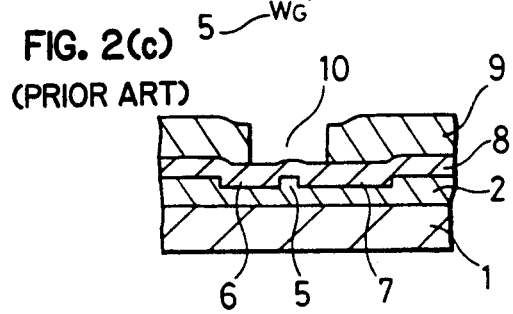

Next, as shown in FIG. 2(c), the positive type resist 4 and the nitride film 3 are removed, and a nitride film 8 is deposited on the active layer 2 by plasma CVD. A resist is deposited on the nitride film 8, and a resist pattern 9 having a T-shaped gate head aperture 10 for producing a head of a T-shaped gate electrode is produced. Herein, the width of the T-shaped gate top aperture is designed to be shorter than the width $W(=W_{GD}'+W_{GS}'+W_G')$ of the above-described broad recess aperture.

Figure 2D:
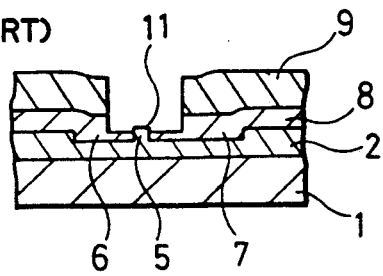
Figure 2E:
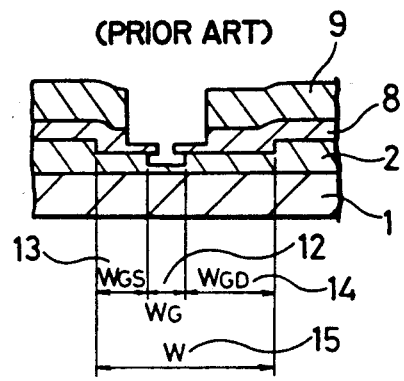

Next, as shown in FIG. 2(d), the nitride film 8 is etched by RIE to expose the top of the dummy gate 5 (the dummy gate top exposure portion is 11). Subsequently, as shown in FIG. 2(e), the active layer 2 is chemical etched using tartaric acid, thereby producing a deeper recess 12 of width $W_G$. Thus, a gate/source recess aperture 13 having width $W_{GS}$ gate/drain recess aperture 13 having width $W_{GD}$ are obtained. By the above-described process, a recess 15 of width $W(=W_{GD}+W_{GS}+W_G)$ and a deeper recess 12 of width $W_G$ are produced having the width relationship of $W_{GS} < W_{GD}$, and a two stage offset recess structure in which the gate/drain interval is narrower than the gate/source interval is produced.

Figure 2F:
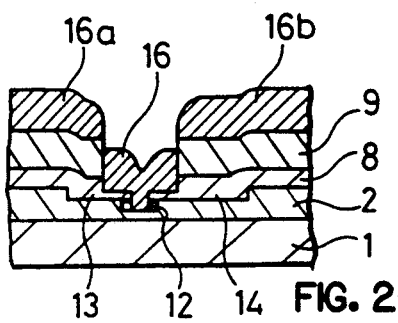
Figure 2F:
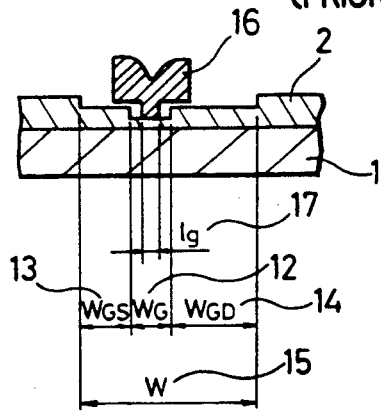

Next, as shown in FIG. 2(f), metal, such as Ti/Mo/Au or Ti/Al as a Schottky barrier metal, is deposited on the entire surface of the substrate to a thickness of about 1 micron by electron beam deposition. Next, the gate metals 16a and 16b and the resist 9 are removed by lift-off. Subsequently, the nitride film 8 is removed by wet etching, thereby producing the offset two stage recess T-shaped gate structure FET having a gate length lg 17 of FIG. 2(g).

According to the production method of the present invention as described above, the nitride film 3 and the active layer 2 are successively etched utilizing the dummy gate resist 4 having a width 0.4 to 0.5 micron as a mask to produce a dummy gate 5 of width $W_G'$ as shown in FIGS. 2(a) to 2(b). Further, the gate length lg of the T-shaped gate 16 which will be produced later is determined by the width $W_G'$ of this dummy gate 5. Therefore, by controlling the side etching of the active layer 2 in the process of FIGS. 2(a) to 2(b), the gate length lg can be less than 0.5 micron, for example, 0.2 micron, and a gate electrode 16 can be produced with high precision. Further, the short gate length means the gate parasitic capacitance can be reduced. Further, since the gate electrode 16 is T-shaped, the cross-sectional area of the gate electrode can be increased, reducing the gate resistance. Further, since the recess is produced in two stages, concentration of electric fields is prevented, and leakage current between the active layer and the buffer layer below the active layer is reduced, and the electric field between the gate and drain is dispersed. Further, since the narrower recess is closer to the source electrode than the drain electrode, the source-to-gate resistance is not increased. In other words, RF performance is enhanced, device performance is improved, and breakdown voltage is increased.

As is evident from the foregoing description, according to an aspect of the present invention, a two stage recess T-shaped gate structure is provided with a relatively broad recess in a semiconductor substrate between a source electrode and a drain electrode, a deeper, narrower width recess in the broader recess closer to the source electrode than the drain electrode, and a T-shaped gate electrode having a broad width head is disposed in the deeper, narrower recess. Therefore, electric fields are dispersed due to the two stages of the recess, the electric field between the gate and drain is dispersed, and the leakage current between the active layer and the buffer layer is reduced. Further, since the narrow recess is closer to the source electrode than the drain electrode, the source-to-gate parasitic resistance is not increased. Further, by the adoption of the T-shaped gate, a reduction in the parasitic capacitance due to the narrow pattern gate length lg and a reduction in the parasitic resistance due to the increase in the gate cross-sectional area is accomplished, thereby resulting in enhancement of device performance and breakdown voltage.

According to another aspect of the present invention, a broad recess portion is produced in a semiconductor substrate with a dummy gate, a pattern for producing a head of T-shaped gate electrode is produced, the top of the dummy gate is exposed utilizing the pattern, and a narrower, deeper recess is produced closer to the source electrode, thereby producing a two stage recessed structure. Thereafter, a T-shaped gate electrode is produced in the deeper recess. Thus, an FET having a T-shaped gate electrode and an offset two stage recess structure can be produced using conventional apparatus, and high breakdown voltage and efficient FETs are produced at low cost and with high precision. Further, a relatively broad recess and a relatively narrow recess can be easily and precisely produced and a gate electrode production pattern can be precisely produced during the production of the recess stage. Thus, the production of a T-shaped gate electrode can be easily accomplished with high precision.

What is claimed is:

1. A production method for a semiconductor device having a T-shaped gate electrode disposed in a two stage recess and having a head comprising:
    forming an active layer on a semiconductor substrate;
    producing a broad recess in said active layer of said semiconductor substrate, leaving a dummy gate in said active layer;
    covering said dummy gate and forming a pattern for producing a head portion of a T-shaped gate electrode opposite said dummy gate;
    exposing said dummy gate utilizing said pattern; then
    producing a narrow recess within the broad recess offset from the center of the broad recess, thereby producing a two stage recess; and
    producing a T-shaped gate electrode in the narrow recess and producing the head of the T-shaped gate electrode using the pattern.

2. The production method of claim 1 comprising:
    producing the broad recess by depositing a first nitride film on said active layer of said semiconductor substrate and etching said first nitride film and said active layer using a first resist pattern as a mask, thereby producing a first gate/source recess of width $W_{GS}'$, a first gate/drain recess of width $W_{GD}'$, and a first dummy gate of width $W_G'$, where $W_{GS}' < W_{GD}'$ and the sum of $W_{GS}'$, $W_G'$, and $W_{GD}'$ equals W, the width of the broad recess;
    removing the first resist pattern and the first nitride film;
    covering said dummy gate and forming a pattern by depositing a second nitride film on the substrate burying the dummy gate, the gate/source recess, and the gate/drain recess and producing a second resist pattern having an aperture for the head of the T-shaped gate electrode on said second nitride film;
    exposing said dummy gate by etching said second nitride film using said second resist pattern as a mask and producing the narrow recess having a width $W_G$ by etching said active layer using said second resist pattern and said second nitride film as a mask, thereby producing a second gate/source recess of width $W_{GS}$ and a second gate/drain recess of width $W_{GD}$, where the sum of $W_G$, $W_{GD}$, and $W_{GS}$ equals W; and
    said T-shaped gate electrode is produced by depositing gate electrode metal and removing said second resist pattern and said gate electrode metal disposed thereon by lift-off and thereafter removing said second nitride film to produce the T-shaped gate electrode in the narrow recess.

3. The production method of claim 2, wherein the ratios of $W_{GS}'$ to $W_{GD}'$ and $W_{GS}$ to $W_{GD}$ are 1:2.

* * * * *